(12) United States Patent
Hoff

(10) Patent No.: US 6,967,176 B1
(45) Date of Patent: Nov. 22, 2005

(54) METHOD FOR MAKING SILICON CONTAINING DIELECTRIC FILMS

(75) Inventor: Andrew M. Hoff, Tampa, FL (US)

(73) Assignee: University of South Florida, Tampa, FL (US)

(*) Notice: Subject to any disclaimer, the term of this patent is extended or adjusted under 35 U.S.C. 154(b) by 31 days.

(21) Appl. No.: 10/605,609

(22) Filed: Oct. 13, 2003

Related U.S. Application Data

(60) Provisional application No. 60/319,607, filed on Oct. 11, 2002.

(51) Int. Cl.[7] .................. H01L 21/31; H01L 21/469
(52) U.S. Cl. ......................... 438/778; 438/906
(58) Field of Search ............... 438/772, 778, 438/788, 791, 792, 799, 906

(56) References Cited

U.S. PATENT DOCUMENTS

| | | | |
|---|---|---|---|
| 4,582,561 A * | 4/1986 | Ioku et al. ............... | 117/56 |
| 5,507,874 A * | 4/1996 | Su et al. ................. | 134/1 |
| 6,077,751 A * | 6/2000 | Marcus et al. ........... | 438/308 |
| 6,299,683 B1 * | 10/2001 | Rupp et al. ............. | 117/88 |

\* cited by examiner

*Primary Examiner*—Phuc T. Dang
(74) *Attorney, Agent, or Firm*—Ronald E. Smith; Smith & Hopen, P.A.

(57) ABSTRACT

Method and apparatus for forming thin silicon oxide films on silicon carbide substrates utilizing an afterglow thermal reactor. The method of forming thin silicon oxide film includes the steps of loading a silicon carbide substrate within a tube, which tube is heated, and the contents pressure is controlled. An oxidizing gas is then passed through an afterglow reactor source or microwave cavity where the gas achieves an excited state of energy. When the neutral species of the excited gas contact the silicon carbide substrate within the heated region of the the tube, a thin silicon oxide film forms on the substrate, at a faster rate and lower temperature than has been known. The tube contents are maintained at a temperature between 600° C. to 1,200° C., and at a pressure less than 50 torr.

13 Claims, 1 Drawing Sheet

METHOD FOR MAKING SILICON CONTAINING DIELECTRIC FILMS

CROSS-REFERENCE TO RELATED DISCLOSURE

This disclosure claims priority from a provisional application entitled "Method of Forming Thin Silicon Films on Silicon Carbide Substrates," filed Oct. 11, 2002 by the present inventor and bearing application No. 60/319,607.

BACKGROUND OF INVENTION

1. Field of the Invention

This invention relates to growing thin films on silicon carbide substrates.

2. Background of the Invention

Metal-oxide-semiconductor are structures which include a silicon-carbide(SiC) substrate and an oxide film grown on the silicon-carbide (SiC) substrate. MOS diodes, MOSFETs and MOSICs are formed on a silicon carbide substrate and used in the art.

Silicon Carbide (SiC) takes various kinds of crystal structures (referred to as polytype), and has a band gap between 2.4 eV and 3.3 eV depending on the crystal structure. The silicon carbide is thermally, chemically and physically stable, and resistant to high-energy particle radiation. Accordingly, silicon carbide (SiC) is favorable for the semiconductor material of, for example, a high temperature operating device, a high power device, a high reliability semiconductor device and a radiation resistant device. The silicon carbide (SiC) is also known to be free from certain problems related to pollution and resources.

It is difficult to effectively form an oxide layer on a SiC semiconductor. Where conventional silicon material thermal oxidation methods are employed to form the oxide layer, the oxidation rate is very slow, and a sharp boundary is not formed between the oxide layer and the SiC substrate.

Thin films of silicon dioxide are conventionally grown on silicon carbide (SiC) substrates at atmospheric pressure in a chemical ambient containing water vapor or other oxidant species at temperatures in the range of 1,000° C. to 1200° C. The film growth rate is slower than that for single crystal silicon by at least a factor of 10. In addition, following the oxidation process an additional many time consuming (3–4 hour) wet ambient process is performed at 950° C. (considered below the temperature at which appreciable oxide would form on SiC) to improve the interface quality between the oxide and the silicon carbide substrate. The process produces carbonaceous clusters up to tens of nanometers in height that are formed as a result of the thermal oxidation of the silicon carbide single crystal.

Atmospheric oxidation in dry $O_2$ requires 14 hours at 1,050° C. to grow 200 Å of film on SiC and 4 hours in wet ambient at the same temperature produces 200 Å.

At atmosphere and aggressive pyrogenic steam ambient, steam formed by reacting $O_2$ with $H_2$ at T>700° C., SiC oxidizes slowly and only at temperatures above roughly 1,000° C. Under comparable conditions single crystal silicon oxidizes at a rate at least ten times faster. Forming silicon containing dielectric films such as $SiO_2$ on a substrate such as SiC at a lower temperature and with less time will be beneficial.

In summary, silicon carbide oxides are slow to form and require temperatures above 1,000° C.

What is needed, then, is an improved method for effectively forming an oxide layer on a SiC semiconductor. The improved method should yield a faster oxidation rate and a sharp boundary between the oxide layer and the SiC substrate.

However, in view of the prior art considered as a whole at the time the present invention was made, it was not obvious to those of ordinary skill in this art how the identified needs could be met.

SUMMARY OF INVENTION

The long-standing but heretofore unfilled need for an improved method for forming an oxide layer on a SiC conductor is now fulfilled by a new, useful, and non-obvious invention.

In this vacuum furnace process, neutral atomic and excited molecular species are generated in a clean microwave plasma source and then flow to the furnace region of the apparatus where they react with the SiC substrates at a prescribed temperature.

Oxidation at sub-atmospheric pressure in the flowing afterglow of a microwave plasma discharge at temperatures below 1000° C. produce comparable films in thickness to prior art in less time. Further, the thickness of film on the silicon carbide substrates is comparable to film thickness values obtained for single crystal silicon processed at the same time in the same afterglow thermal chamber.

The afterglow process method grows films faster than achievable at atmospheric pressure and at lower temperatures. Presumably this is due to the afterglow chemistry since the number density of reactants is ~1,000 smaller and the temperatures are ~200 C lower than the current art.

Additionally, with the afterglow method oxide films nearly 700 Å thick have been grown at 1,100° C. in one hour at 1 Torr, a rate three times greater than has been known at the same temperature in conventional steam processes. Therefore, the reactivity of the afterglow species with SiC is orders of magnitude higher than that of steam reacting at atmosphere.

The novel method of forming a thin silicon oxide film includes the steps of providing a silicon carbide substrate, passing an oxidizing gas through an oscillating radio frequency electric field such that the gas achieves an excited state of energy, and guiding the excited gas so that said excited gas contacts the substrate held at a predetermined temperature. The inductive field may be created by using an afterglow thermal reactor containing a microwave cavity. The oxidizing gas is selected from the group consisting of molecular oxygen, atomic oxygen, excited molecular $O_2$ (singlet delta g state), and nitrogen oxides. Moreover, the oxidizing gas is maintained at a pressure less than 50 torr and the substrate in a temperature range between 600° C. to 1,200° C. The pressure is maintained using a vacuum pump. The substrate is silicon carbide and is secured onto a heated zone.

A further method of forming thin silicon oxide film includes the steps of providing a silicon substrate within a tube, passing an oxidizing gas through an oscillating radio frequency electric field so that the gas achieves an excited state of energy, and permitting the excited gas to contact the substrate. The tube is maintained at a temperature between 600° C. to 1,200° C. and at a pressure less than 50 torr.

Another method of forming thin silicon oxide film includes the steps of providing a silicon carbide substrate within a tube so that the tube is in contact with a furnace and is connected to a pump. An oxidizing gas is passed through an afterglow thermal reactor so that the gas achieves an excited state of energy. Additionally, a secondary gas is added to the flow of excited gas eminating from the plasma to modify the gas chemistry such as to enhance the production of ground state oxygen, before contacting the substrate. The excited gas mixture then is permitted to contact the substrate within the tube. The tube is maintained at a temperature between 600° C. to 1,200° C. and at a pressure less than 50 torr.

For a fuller understanding of the nature and objects of the invention, reference should be made to the following detailed description, taken in connection with the accompanying drawings, in which.

DETAILED DESCRIPTION

Figure 1:
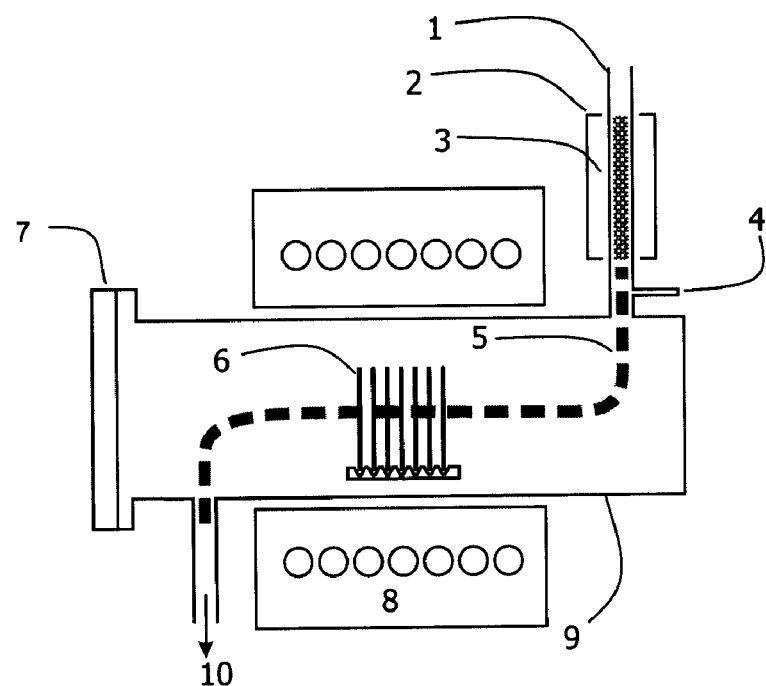
FIG. 1 is a schematic diagram of the present invention.

Referring now to FIG. 1, it will there be seen that an illustrative embodiment of the invention is depicted in diagrammatic form.

Silicon carbide substrate 6 is introduced into tube 9 through loading port 7. Furnace 8 encircles tube 9 so that the temperature within tube 9 may be controlled. Pump 10 is in fluid communication with tube 9 so that the pressure within tube 9 may be controlled. An oxidizing gas 1 is passed through an afterglow source such as a microwave cavity 2 so that gas 1 achieves an excited state of energy 3 or plasma phase that upon its exit from said cavity is in a neutral state. Afterglow species 5 then contacts substrate 6 within tube 9 which functions as an afterglow vessel. Furnace 8 maintains tube 9 and hence substrate 6 at a temperature between 600° C. to 1,200° C. and pump 10 maintains said tube at a pressure less than 50 torr.

More particularly, silicon carbide substrate 6 is supported within fused silica tube 9, or any appropriate vessel such that ions, electrons, and photons are excluded from the thermal region where the substrates are held. Silicon carbide substrate 6 or wafer may be oxidized while mounted on a holder that supports substrate 6. Substrate 6, which is preferably silicon carbide, is placed in tube 9 through load port 7 as aforesaid. Furnace 8 surrounds afterglow vessel 9. A microwave glow discharge acts as a source of chemical species 5 which flows within said afterglow vessel 9. The reference numeral 4 denotes a port of entry for a secondary gas that is added, upstream of substrate 6, to the flow of excited gas or plasma to modify the afterglow species chemistry for example to enhance the production of ground state oxygen.

In this process where the gas species which are to be passed through the afterglow thermal reactor include, but are not limited to, $O_2$ (molecular oxygen), O (atomic oxygen), excited molecular $O_2$ (singlet delta g state), and nitrogen oxides. The gas species in this application are oxidizers for the silicon carbide. The afterglow source which promotes the oxidizing gas to an excited state may be a microwave cavity such as the one depicted in FIG. 1. In its excited state, the oxidizing gas is in plasma form the neutral species of which, known as the afterglow, then continues or passes to the thermal or furnace region of the vessel where the silicon carbide substrate is placed. In the furnace region of the system, the oxidizing gas in its excited state, the afterglow species make contact with the silicon carbide substrate.

For oxide formation an afterglow, or remote plasma, processing system is employed to facilitate the oxidation of SiC substrates. In the afterglow system, the energy to produce reactive oxidants is provided by the electrons in a low plasma potential microwave discharge. The oxidants then travel to the hot zone of a vacuum furnace where they react with the silicon carbide crystals.

Figure 2:
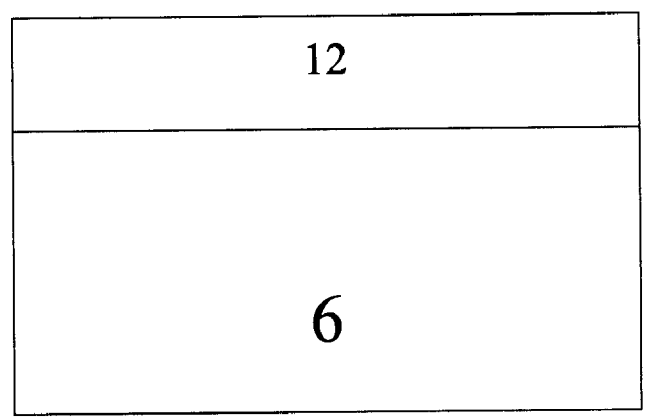
FIG. 2 is a sectional view of silicon carbide substrate with a thin film of silicon oxide.

As shown in FIG. 2, thin films 12 are grown using only the materials of the single crystal substrates, (silicon carbide, and the chemical species 5 created by the glow discharge source that flow into the heated zone of the vacuum furnace where substrates 6 are supported. A repeated thin film growth has been demonstrated at temperatures as low as 600° C. on silicon carbide and silicon. In the afterglow chemical environment noted above, film thickness of 200 Å is obtained in 2 hours at 800° C. and 1 Torr total pressure. Silicon has also been oxidized at the same time and temperature in the afterglow species chemistry obtaining roughly 200 Å of film. The interior of tube 9 is maintained at a temperature between 600° C. to 1,200° C. by furnace 8, and at a pressure less than 50 torr by pump 10.

The present method has also demonstrated the growth of oxide films on various polytype and doping types of SiC and on p-type (100) oriented silicon from 20 Å to near 300 Å thick, grown in an oxidant flux generated by a remote plasma or afterglow source, at temperatures ranging from 400° C. to 800° C., times from 30 to 120 minutes, and total system pressure near 1 Torr.

The thermal oxidation of SiC in an afterglow, or remote plasma, processing system opens new pathways to address oxide growth rate and quality issues. In afterglow chemical processing, the generation of reactants is accomplished by exciting precursor gases in a clean microwave discharge. Charged species and light generated in this source are confined to the plasma source region while a high mass flux of reactants flow to the furnace region of the apparatus where they may react with the substrates at a prescribed temperature as shown in FIG. 1. The afterglow gas chemistry used in this work was $O_2$ and 10% volume flow of $N_2O$. Previous work has shown that in its un-excited state at 1 Torr and 800° C. this mixture produces little if any oxide on SiC. The $N_2O$ is added to enhance the production of ground state O and serves no other known purpose. The two principal oxidant species produced in this system are O and the singlet state of $O_2$, $O_2$ (a $^1\Delta g$) also denoted $O_2$*. An estimate of the yield of each of these species varies from 10% to 20% in the flow or $\sim 10^{15}$ (O atoms or $O_2$ (a $^1\Delta g$) molecules)/cm$^3$ flowing to the furnace for reaction with the semiconductor substrates. Hence, the afterglow oxidation of silicon carbide by analogy to traditional oxidation of materials such as silicon is strictly a chemical process between the O and $O_2$* and the silicon carbide substrate. The advantage here is the reaction enthalpy gained by generating these oxidants in the non-thermal manner of the plasma source.

The excited state of $O_2$ is probably responsible for the enhanced rate of reaction of this gas mixture in the case of SiC where carbon is present. However, the entire process may be due to O (atomic oxygen) alone. Therefore, the film growth rates observed for silicon carbide at a pressure of atmosphere/1000 or 1 Torr (where 1 atmosphere= 760 Torr) and at temperatures less than 1,000° C., actually 900° C. down to 600° C. were unexpected and are likely due to the unique chemistry environment present.

The present method uses an afterglow thermal reactor to form thin films of for example $SiO_2$ on Silicon Carbide at temperatures below 1200° C. and at reduced pressure, i.e. 1 Torr total pressure. Silicon Carbide would be expected to oxidize slower than silicon as it does in atmospheric processes. Yet in this afterglow chemistry ($O_2$ or a mixture of $O_2$ and $N_2O$, or any other oxidizing species) at temperatures below 900° C. and at total pressure near 1 Torr, SiC oxidizes at nearly the same rate as silicon in the same environment.

This provides a productive (faster) and less energy consumptive (lower temperature) process to form thin films of oxide on silicon carbide substrates. To date both n- and p-type SiC have been oxidized with polytypes 4H and 6H. Such processing could be applied to passivation of SiC bulk materials such as tooling pieces, the formation of insulating layers to passivate surface electronic states in silicon carbide based electronic devices, the formation of gate insulator layers for metal oxide semiconductor field effect transistors (MOSFETs) using silicon carbide as the semiconducting substrate, and for the formation of sacrificial oxides to remove surface damage on silicon carbide semiconducting substrates.

Prior experience of the inventor using a similar apparatus to remove polymeric photo-resists showed that there are three predominant species present in the afterglow of molecular oxygen. They are $O_2$, atomic oxygen (O), and an excited state of $O_2$ known as singlet delta g. In photoresist removal where the resist outer surface had been rendered "graphitic" by interaction with a dose of ions implanted at a dose level of $10^{15}/cm^2$ a microwave generated afterglow removed the polymer film in ~40 seconds at 200° C. Electron spin resonance gas species concentration measurements of a flowing microwave afterglow generated from $O_2$ showed that O was reduced when a polymer or graphite was placed between the source and the measurement apparatus and that the singlet delta g state of $O_2$ was reduced in density, only when graphite was inserted between the source and the measurement instrument.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of forming thin silicon oxide film, comprising the steps of:
   providing a silicon carbide substrate;
   providing an afterglow thermal reactor;
   employing said afterglow thermal reactor to create an oscillating radio frequency electric field;
   exciting an oxidizing gas to an excited state of energy by passing the oxidizing gas through the oscillating radio frequency electric field; and
   contacting the substrate with the excited gas at a predetermined temperature.

2. The method of claim 1, further comprising the step of selecting the oxidizing gas from the group consisting of molecular oxygen, atomic oxygen, excited molecular $O_2$ (singlet delta g state), and nitrogen oxides.

3. The method of claim 1, further comprising the step of maintaining the oxidizing gas at a temperature range between 600° C. to 1,200° C.

4. The method of claim 1, further comprising the step of maintaining the oxidizing gas at a pressure less than 50 torr.

5. The method of claim 4, further comprising the step of using a vacuum pump to maintain the pressure.

6. A method of forming thin silicon oxide film, comprising the steps of:
   providing a silicon carbide substrate within a tube;
   exciting an oxidizing gas to an excited state of energy by passing the oxidizing gas through an oscillating radio frequency electric field; and
   contacting the substrate with the excited gas, maintaining the tube and substrate at a temperature range between 600° C. to 1,200° C., and at a pressure less than 50 torr.

7. A method of forming thin film of silicon oxide, comprising the steps of:
   providing a furnace;
   providing a tube;
   providing a pump that is in fluid communication with the tube;
   positioning a silicon carbide substrate within the tube;
   providing an afterglow plasma source;
   passing an oxidizing gas through the afterglow plasma source so that the gas achieves an excited state of energy;
   adding a secondary gas to the excited gas to produce an excited gas mixture; and
   contacting the substrate with the excited gas mixture, using the furnace to maintain the tube at a temperature between 600° C. to 1,200° C., and using the pump to maintain the tube at a pressure less than 50 torr.

8. A method of forming thin silicon oxide film, comprising the steps of:
   providing a silicon carbide substrate;
   providing a microwave cavity;
   employing said microwave cavity to create an oscillating radio frequency electric field;
   exciting an oxidizing gas to an excited state of energy by passing the oxidized gas through the oscillating radio frequency electric field;
   positioning the substrate in remote relation to said microwave cavity;
   contacting the substrate held at a predetermined temperature with the excited gas.

9. The method of claim 8, further comprising the step of selecting the oxidizing gas from the group consisting of molecular oxygen, atomic oxygen, excited molecular $O_2$ (singlet delta g state), and nitrogen oxides.

10. The method of claim 8, further comprising the step of maintaining the oxidizing gas at a temperature range between 600° C. to 1,200° C.

11. The method of claim 8, further comprising the step of maintaining the oxidizing gas at a pressure less than 50 torr.

12. The method of claim 8, further comprising the step of using a vacuum pump to maintain the pressure.

13. The method of claim 8, further comprising the step of securing the silicon carbide substrate onto a heated zone.

* * * * *